United States Patent
Otori et al.

(10) Patent No.: US 7,403,408 B2
(45) Date of Patent: Jul. 22, 2008

(54) SEMICONDUCTOR MEMORY DEVICE AND SEMICONDUCTOR DEVICE

(75) Inventors: Hiroshi Otori, Mizuho (JP); Masatoshi Hasegawa, Hamura (JP); Mitsugu Kusunoki, Kunitachi (JP); Masatoshi Sakamoto, Hamura (JP)

(73) Assignee: Hitachi, Ltd., Tokyo (JP)

( * ) Notice: Subject to any disclaimer, the term of this patent is extended or adjusted under 35 U.S.C. 154(b) by 231 days.

(21) Appl. No.: 11/134,389

(22) Filed: May 23, 2005

(65) Prior Publication Data

US 2005/0259500 A1 Nov. 24, 2005

(30) Foreign Application Priority Data

May 24, 2004 (JP) ............................. 2004-152652

(51) Int. Cl.
*G11C 5/02* (2006.01)
(52) U.S. Cl. ...................... 365/51; 365/63; 365/230.03
(58) Field of Classification Search ............ 365/230.03, 365/230.06, 189.08, 51, 63
See application file for complete search history.

(56) References Cited

U.S. PATENT DOCUMENTS

| | | | | |
|---|---|---|---|---|
| 5,335,203 A | * | 8/1994 | Ishii et al. .................... | 365/226 |
| 5,473,573 A | * | 12/1995 | Rao ....................... | 365/230.01 |
| 5,943,285 A | | 8/1999 | Kohno .................... | 365/230.03 |
| 6,141,286 A | * | 10/2000 | Vo et al. ................. | 365/230.03 |
| 6,873,563 B2 | * | 3/2005 | Suwa et al. ............. | 365/230.03 |
| 2005/0024949 A1 | | 2/2005 | Hokari et al. ........... | 365/189.07 |
| 2006/0176752 A1 | * | 8/2006 | Lindstedt .................... | 365/226 |

* cited by examiner

*Primary Examiner*—Richard T. Elms
*Assistant Examiner*—Hien N Nguyen
(74) *Attorney, Agent, or Firm*—Miles & Stockbridge P.C.

(57) ABSTRACT

A semiconductor memory device that satisfies needs of both a large number of memory banks and a higher operation speed is provided. A semiconductor memory device includes a plurality of data terminal pads, and a plurality of memory banks independently subject to memory access. Each of the memory banks is divided into a plurality of submemory banks. The data terminal pads are also divided into a plurality of groups so as to be associated with submemory banks obtained by the division. Blocks each including submemory banks obtained by the division and data terminal pads associated with the submemory banks are arranged so as not to overlap each other on a semiconductor chip.

18 Claims, 15 Drawing Sheets

FIG. 10

54-PIN PLASTIC TSOP (II)

| | | | | |
|---|---|---|---|---|
| VDD | 1 | | 54 | VSS |
| DQ0 | 2 | | 53 | DQ15 |
| VDDQ | 3 | | 52 | VSSQ |
| DQ1 | 4 | | 51 | DQ14 |
| DQ2 | 5 | | 50 | DQ13 |
| VSSQ | 6 | | 49 | VDDQ |
| DQ3 | 7 | | 48 | DQ12 |
| DQ4 | 8 | | 47 | DQ11 |
| VDDQ | 9 | | 46 | VSSQ |
| DQ5 | 10 | | 45 | DQ10 |
| DQ6 | 11 | | 44 | DQ9 |
| VSSQ | 12 | | 43 | VDDQ |
| DQ7 | 13 | | 42 | DQ8 |
| VDD | 14 | | 41 | VSS |
| LDQM | 15 | | 40 | NC |
| /WE | 16 | | 39 | UDQM |
| /CAS | 17 | | 38 | CLK |
| /RAS | 18 | | 37 | CLE |
| /CS | 19 | | 36 | A12 |
| BA0 | 20 | | 35 | A11 |
| BA1 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| VDD | 27 | | 28 | VSS |

(TOP VIEW)

FIG. 11

90-BALL FBGA

|   | 1 | 2 | 3 | 4 | 5 | 6 | 7 | 8 | 9 |
|---|---|---|---|---|---|---|---|---|---|
| A | DQ26 | DQ24 | VSS | | | | VDD | DQ23 | DQ21 |
| B | DQ28 | VDDQ | VSSQ | | | | VDDQ | VSSQ | DQ19 |
| C | VSSQ | DQ27 | DQ25 | | | | DQ22 | DQ20 | VDDQ |
| D | VSSQ | DQ29 | DQ30 | | | | DQ17 | DQ18 | VDDQ |
| E | VDDQ | DQ31 | NC | | | | NC | DQ16 | VSSQ |
| F | VSS | DQM3 | A3 | | | | A2 | DQM2 | VDD |
| G | A4 | A5 | A6 | | | | A10 | A0 | A1 |
| H | A7 | A8 | NC | | | | NC | BA1 | A11 |
| J | CLK | CKE | A9 | | | | BA0 | /CS | /RAS |
| K | DQM1 | NC | NC | | | | /CAS | /WE | DQM0 |
| L | VDDQ | DQ8 | VSS | | | | VDD | DQ7 | VSSQ |
| M | VSSQ | DQ10 | DQ9 | | | | DQ6 | DQ5 | VDDQ |
| N | VSSQ | DQ12 | DQ14 | | | | DQ1 | DQ3 | VDDQ |
| P | DQ11 | VDDQ | VSSQ | | | | VDDQ | VSSQ | DQ4 |
| R | DQ13 | DQ15 | VSS | | | | VDD | DQ0 | DQ2 |

(TOP VIEW)

SEMICONDUCTOR MEMORY DEVICE AND SEMICONDUCTOR DEVICE

CROSS-REFERENCE TO RELATED APPLICATION

This application is related to U.S. application Ser. No. 10/860,770 filed Jun. 4, 2004, the contents of which are incorporated herein by reference.

INCORPORATION BY REFERENCE

The present application claims priority from Japanese application JP2004-152652 filed on May 24, 2004, the content of which is hereby incorporated by reference into this application.

BACKGROUND OF THE INVENTION

The present invention relates to a semiconductor memory device and a semiconductor device. For example, the present invention relates to a technique that is effective for use in a dynamic RAM (random access memory) having a multi bank structure and a semiconductor device having the dynamic RAM mounted thereon.

In a semiconductor memory device proposed in U.S. Pat. No. 5,943,285 as a semiconductor memory device suitable for a large-scale memory capacity, its memory area is divided into 3×3=9 areas having equal areas. A main control block is disposed in a central area. Memory blocks including a memory cell array, a data input output circuit, and a memory control circuit are disposed in eight peripheral areas.

SUMMARY OF THE INVENTION

The present inventors have studied to increase the speed of a DRAM by providing a plurality of memory banks (DRAM macro-cells) each having an address latch circuit so as to be able to conduct memory access independently, conducting pipeline operation, i.e., accessing one memory bank and obtaining a readout signal while successively accessing other memory banks, and thereby making an access time taken since start of access to a specific memory bank until read out data is obtained, substantially invisible. At this time, the present inventor has found that increasing the number of memory banks increases a signal propagation distance between data input and output pads disposed in a peripheral area of a chip and memory banks disposed in its opposite peripheral area of the chip and such a signal propagation distance constrains the memory operation speed and becomes a factor that hinders high speed operation.

An object of the present invention is to provide a semiconductor memory device and a semiconductor device that satisfy needs of both a large number of memory banks and a higher operation speed. The above-described object and other objects and novel features of the present invention will become apparent from the ensuing description and accompanying drawings.

A representative aspect of the present invention will now be described briefly. A semiconductor memory device includes a plurality of data terminal pads, and a plurality of memory banks independently subject to memory access. Each of the memory banks is divided into a plurality of submemory banks. The data terminal pads are also divided into a plurality of groups so as to be associated with submemory banks obtained by the division. Blocks each including submemory banks obtained by the division and data terminal pads associated with the submemory banks are arranged so as not to overlap each other on a semiconductor chip.

Needs of both a large number of memory banks and a higher operation speed can be satisfied.

Other objects, features and advantages of the invention will become apparent from the following description of the embodiments of the invention taken in conjunction with the accompanying drawings.

BRIEF DESCRIPTION OF THE DRAWINGS

FIG. 10 is a package diagram showing another embodiment of a semiconductor memory device according to the present invention;

FIG. 11 is a package diagram showing still another embodiment of a semiconductor memory device according to the present invention;

DESCRIPTION OF THE EMBODIMENTS

Figure 1:
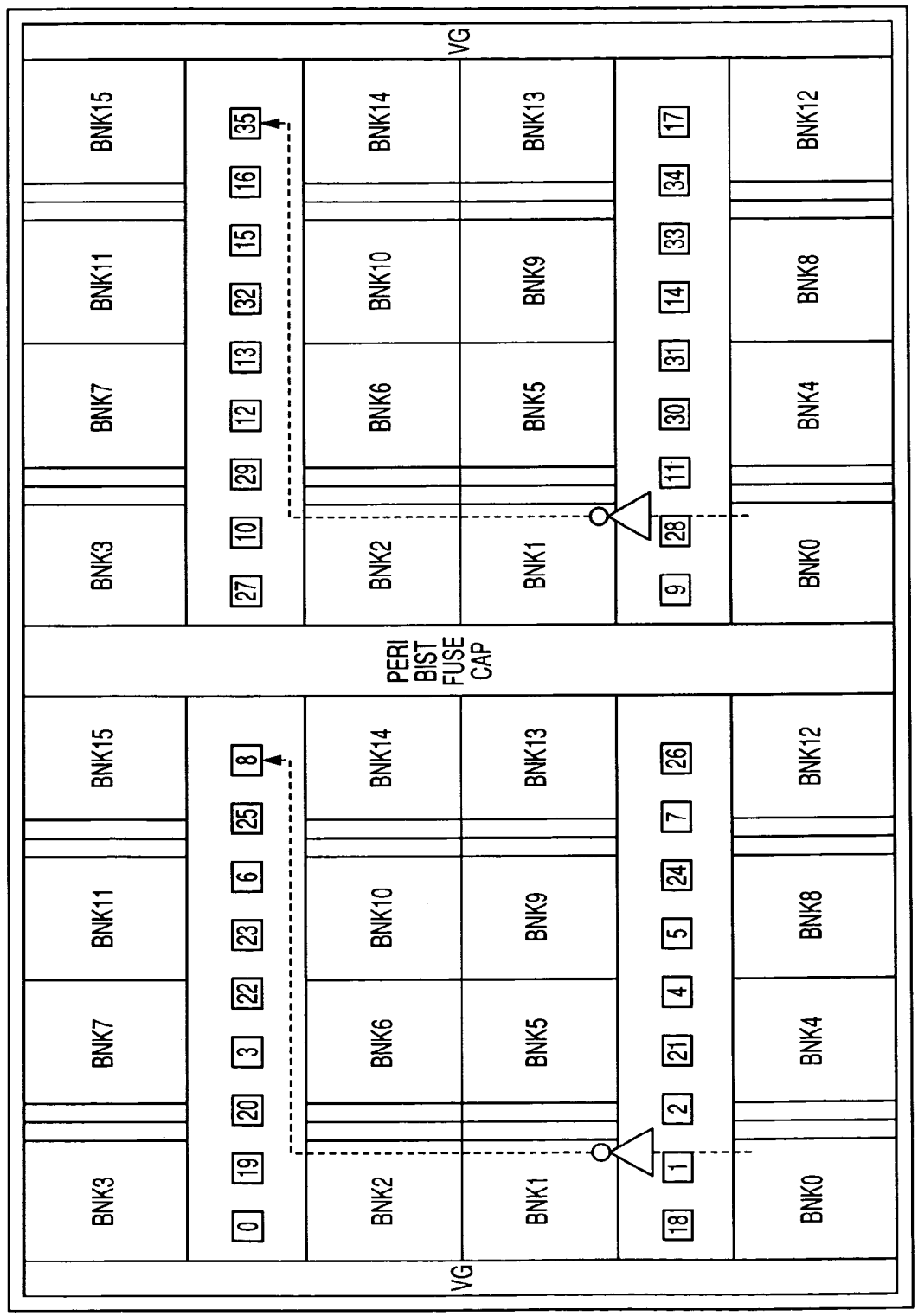
FIG. 1 is a schematic layout diagram showing an embodiment of a semiconductor memory device according to the present invention.

FIG. 1 is a schematic layout diagram showing an embodiment of a semiconductor memory device according to the present invention. Among circuit blocks included in a dynamic RAM according to the present invention, its principal area is shown in FIG. 1. It is formed on one semiconductor substrate such as single crystal silicon by using known semiconductor integrated circuit manufacturing techniques. In this embodiment, a peripheral circuit area represented by a peripheral circuit PERI is provided in a central area with respect to a longitudinal direction of a semiconductor chip. The semiconductor chip is bisected by such a peripheral circuit area. Memory banks BNK0 to BNK15 are provided on each of areas obtained by bisecting the semiconductor chip.

In other words, one memory bank BNK0 includes two memory banks BNK0 disposed on both sides of the peripheral circuit area.

Each of the areas by bisecting the semiconductor chip in the longitudinal direction of the semiconductor chip is bisected in the lateral (shorter side) direction. Sixteen memory banks are thus bisected into two 8-block areas. Sixteen, for example, four by four memory banks BNK0 to BNK15 are provided on each of areas obtained by bisecting the semiconductor chip in the longitudinal direction of the semiconductor chip. And four memory banks, such as, for example, BNK0, BNK4, BNK8 and BNK12, are arranged in the longitudinal direction of the semiconductor chip. Four memory banks, such as, for example, BNK0, BNK1, BNK2 and BNK3, are arranged in the lateral direction of the semiconductor chip as well. Data input and output pads are arranged side by side in the longitudinal direction between the BNK0, BNK4, BNK8 and BNK12 and BNK1, BNK5, BNK9 and BNK13 arranged in the longitudinal direction of the semiconductor chip. Data input and output pads are also arranged side by side in the longitudinal direction between the BNK2, BNK6, BNK10 and BNK14 and BNK3, BNK7, BNK11 and BNK15 arranged in the longitudinal direction. In other words, the semiconductor chip is bisected in the lateral direction of the chip. In a central area of each of semiconductor areas obtained by bisecting the semiconductor chip, data input and output pads are arranged in the longitudinal direction side by side. Eight memory banks are arranged so as to sandwich the input and output pads between four memory banks and four memory banks.

On the whole, two rows each having eighteen data input and output pads are provided on the semiconductor chip in the longitudinal direction. In the DRAM in this embodiment, therefore, data are written and read out by taking 36 bits as the unit. Eighteen bits obtained by bisecting 36-bit data are assigned to two groups of the memory banks BNK0 to BNK15 obtained by the bisection, respectively. As a whole, reading or writing with 36 bits taken as the unit is made possible.

Besides data inputting and outputting with 36 bits as the unit, development into products which conduct data inputting and outputting by taking 18 bits as the unit is made possible in this embodiment by a partial mask alteration such as bonding option. Therefore, data input and output pads 0 to 35 are not simply arranged in the two rows. As represented by numerals in FIG. 1, eighteen bits 0 to 17 among 0 to 35 are distributed between a left half area and a right half area of FIG. 1. For example, 0 to 8 are distributed to the left half area, and 9 to 17 are distributed to the right half area. Eighteen bits 18 to 35 are distributed between the left half area and the right half area of FIG. 1. For example, 18 to 35 are distributed to the left half area, and 27 to 35 are distributed to the right half area.

In the left half area of FIG. 1, the data input and output pads 0 to 8 are distributed between two rows of data input and output pads respectively shown in upper and lower areas of FIG. 1. For example, data input and output pads respectively associated with four bits 0, 3, 6 and 8 are arranged on the upper row, and data input and output pads respectively associated with five bits 1, 2, 4, 5 and 7 are arranged on the lower row. In the right half area of FIG. 1, the data input and output pads 9 to 17 are distributed between the upper and lower rows of data input and output pads of FIG. 1. For example, data input and output pads 10, 12, 13, 15 and 16 associated with five bits are arranged in the upper row, and data input and output pads 9, 11, 14 and 17 associated with four bits are arranged in the lower row. In a product having a 18-bit structure, therefore, data output circuits provided so as to be associated with the data input and output pads 10 to 17 operate on the semiconductor chip distributively as described above. Thus, it is possible to avoid the problem that concentration of noise to a specific place caused by operation of data output buffers lowers the operation margin of memory banks disposed around the specific place.

Paying attention to, for example, the memory bank BNK0 in this embodiment, a longest signal transmission route is formed as represented by a broken line in FIG. 1. In other words, signal routes leading respectively from the two memory banks BNK0 in the left and right half areas to the data input and output pads 8 and 35 are formed. The signal route can be shortened to approximately half as compared with the case where the memory bank is not bisected as described above. For example, if the memory bank is not bisected in the left and right areas of the semiconductor chip, for example, the memory bank BNK0 in the left half area and its adjacent memory bank BNK4 form one memory bank. In such a case, a signal transmission route leading from the memory bank to the pad 35 disposed at the chip end on the opposite side becomes twice as long as that indicated by the broken line. In FIG. 1, each of inverter circuits represents an amplifier circuit in the signal transmission route as described above.

With reference to FIG. 1, a BIST (test circuit), a state machine, and a CAP (capacitor for internal power supply stabilization) as well as a peripheral circuit PERI including address buffers and a control circuit are provided in the peripheral circuit area. Pads associated with address terminals and control terminals are arranged side by side in the lateral direction. Internal power supply circuits VG are provided at both ends of the chip in the longitudinal direction. The internal power supply circuit includes, for example, a regulating voltage circuit, a boosting voltage circuit, and a circuit which generates back bias voltage for substrate.

Figure 2:
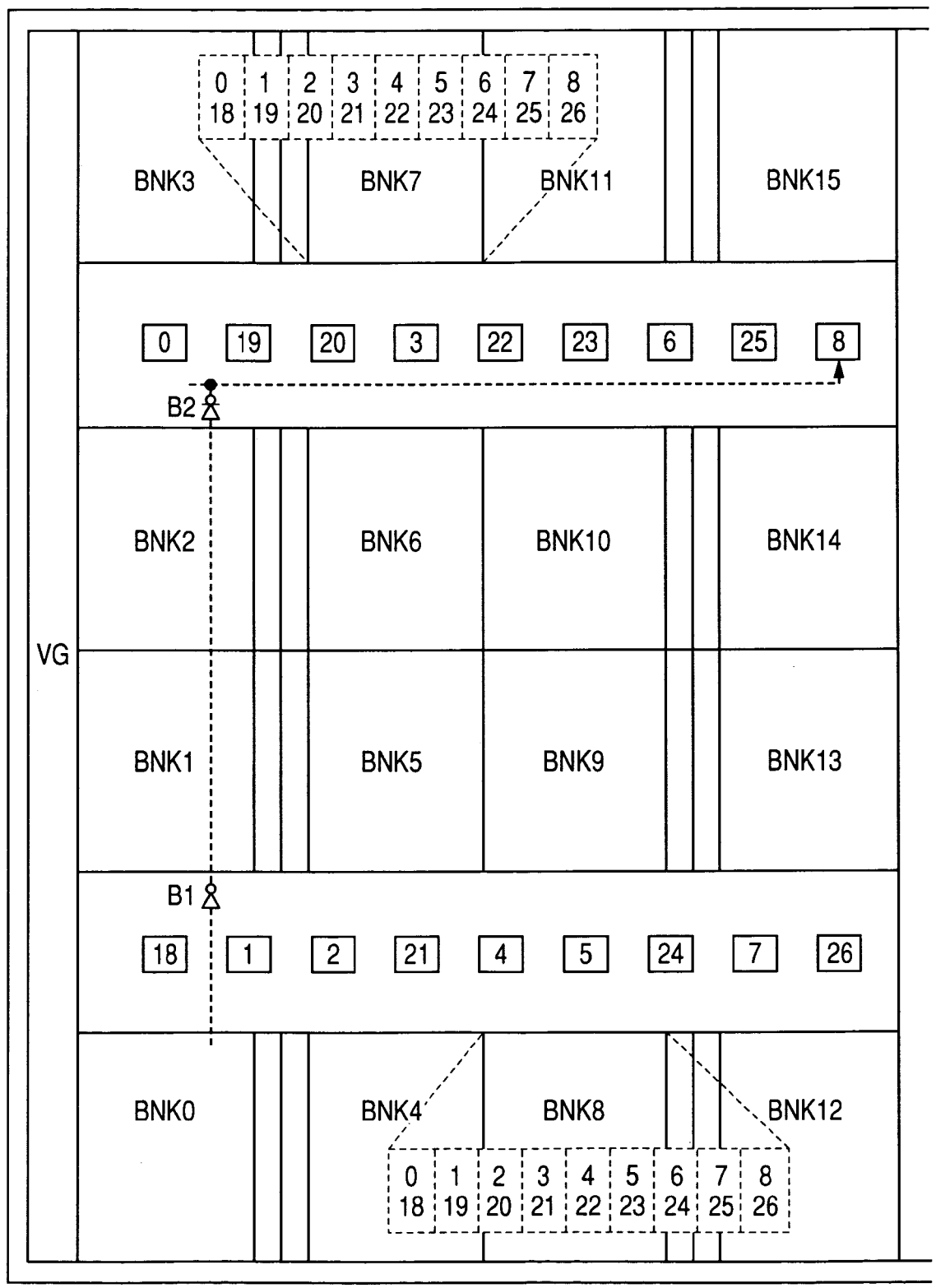
FIG. 2 is a chip configuration diagram of a left half obtained by dividing the memory device shown in FIG. 1.

FIG. 2 is a chip configuration diagram of a left half obtained by dividing the memory device shown in FIG. 1. In this embodiment, each memory bank is adapted to have data terminals 0 to 8 and 18 to 26 as represented by the memory banks BNK8 and BNK7. With reference to the memory bank BNK8, data terminals 18, 1, 2, 21, 4, 5, 24, 7 and 26 associated with nine bits included in data terminals associated with eighteen bits are connected to data input and output pads 18, 1, 2, 21, 4, 5, 24, 7 and 26 via signal paths. Data terminals 0, 19, 20, 3, 22, 23, 6, 25 and 8 associated with nine remaining bits are passed over the memory banks BNK9 and BNK10 opposed to the memory bank 8 and connected to data input and output pads 0, 19, 20, 3, 22, 23, 6, 25 and 8 associated with nine bits in the same way as exemplified by a broken line with reference to the memory bank BNK0.

With reference to the memory bank BNK7, data terminals 18, 1, 2, 21, 4, 5, 24, 7 and 26 associated with nine bits included in data terminals associated with eighteen bits are passed over the memory banks BNK6 and BNK5 opposed to the memory bank 7 and connected to data input and output pads 18, 1, 2, 21, 4, 5, 24, 7 and 26 associated with nine bits, conversely to the memory bank BNK8. Data terminals 0, 19, 20, 3, 22, 23, 6, 25 and 8 associated with nine remaining bits are connected to data input and output pads 0, 19, 20, 3, 22, 23, 6, 25 and 8 via signal paths. As regards other memory banks as well, similar connections are conducted. When a 18-bit structure is used as described above, selection associated with nine bits 0 to 9 is conducted according to the address information, and connections to data input and output pads 0 to 8 arranged distributively as described above are conducted.

As exemplified with respect to the memory bank BNK0 in FIG. 2, one of data paths in the readout system is adapted to pass through the memory banks BNK1 and BNK2 via a buffer B1 and drive a data bus extended in the longitudinal direction of the chip via a tristate circuit. This data bus is connected to, for example, the data input and output pad 8. When activated, the tristate circuit amplifies readout data passed through the buffer B1, and drives the data bus. When the tristate circuit is in the inactive state, its output assumes a high impedance state and the data bus is used to transmit a readout signal from another memory bank.

Figure 3:
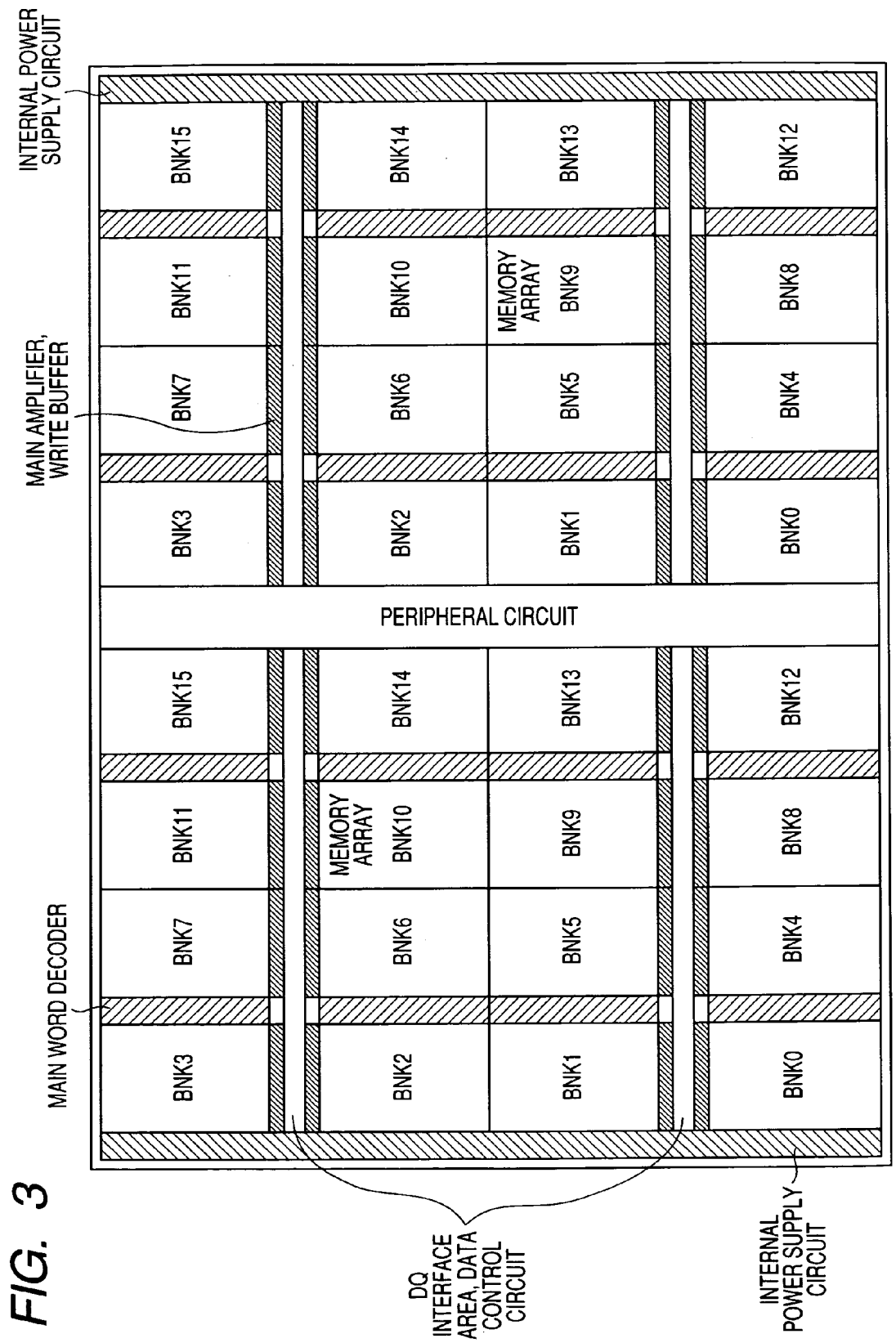
FIG. 3 is a general layout diagram showing an embodiment of a semiconductor memory device shown in FIG. 1.

FIG. 3 is a general layout diagram showing an embodiment of a semiconductor memory device shown in FIG. 1. In this embodiment, a peripheral circuit is disposed in a central area of a chip in the longitudinal direction so as to bisect the whole chip in the same way as the embodiment shown in FIG. 1. Internal power supply circuits are disposed at both ends of the chip in the longitudinal direction. Although omitted in FIG. 3, two pad rows including data input and output pads which extend in the longitudinal direction are disposed respectively in intermediate areas in the lateral direction of semiconductor areas obtained by bisecting a semiconductor area. A DQ interface area and a data control circuit are disposed in each of the intermediate areas. Each memory bank includes a memory array area, a main word decoder, and a main amplifier as exemplified as its principal area.

Figure 4:
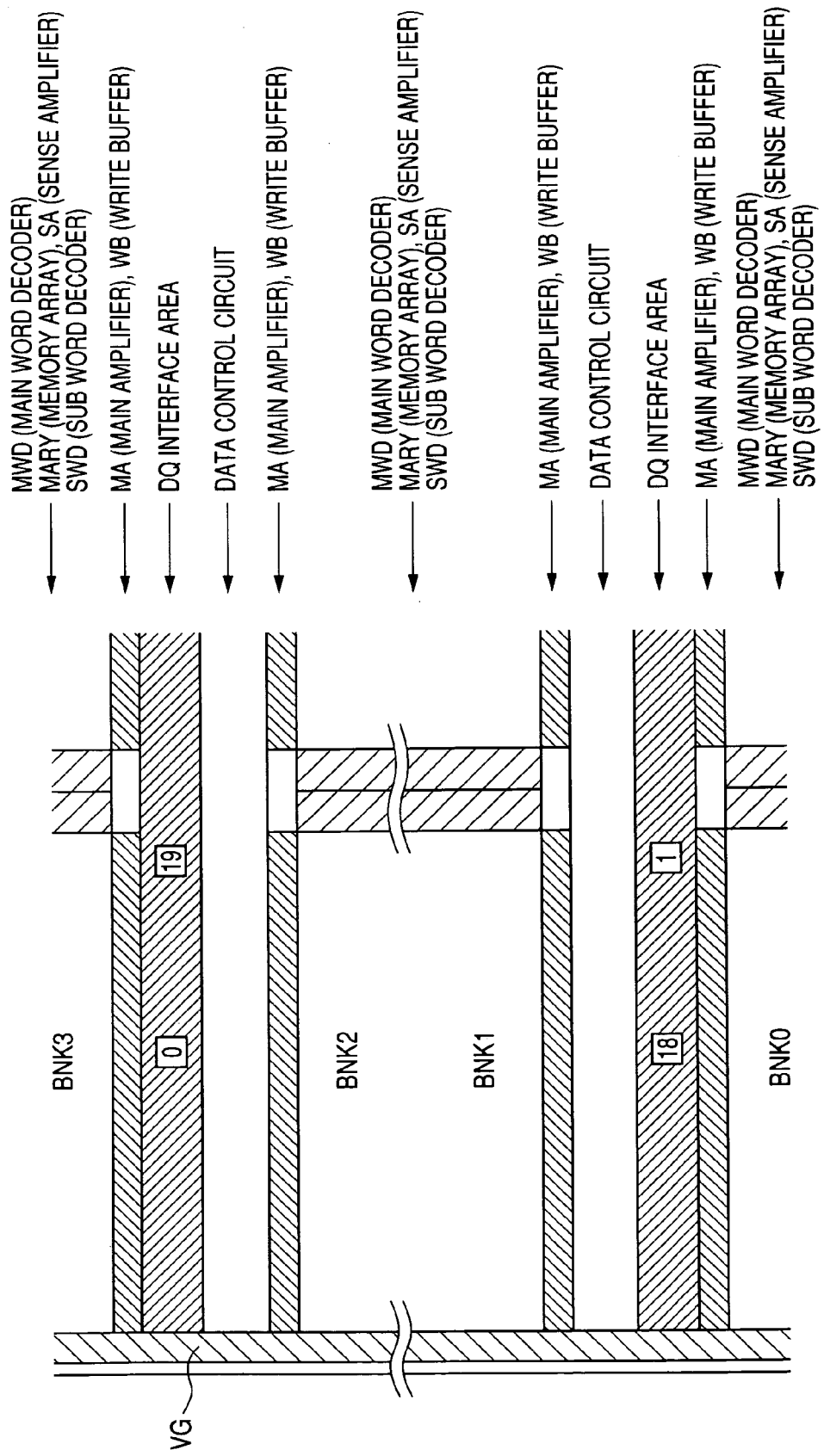
FIG. 4 is an enlarged layout diagram of the semiconductor memory device shown in FIG. 1.

FIG. 4 is an enlarged layout diagram of the semiconductor memory device shown in FIG. 1. A part of the memory banks BNK0, BNK1, BNK2 and BNK3 is shown in FIG. 4 as an example. In each of BNK0, BNK1, BNK2 and BNK3, a main amplifier MA and a write buffer WB are disposed in an area opposed to the DQ interface circuit area and the data control circuit. The data input and output pads 18, 1, 0 and 19 are provided in the DQ interface areas. A pad, an input circuit, an output circuit, and a protection device for electrostatic discharge are provided in the DQ interface area. In each of the memory banks BNK0 to 3, a main word decoder MWD, a memory array MARY, a sense amplifier SA, and a sub word decoder SWD are provided as described later.

When seen from the central area of the chip, the DQ interface areas are disposed outside the data control circuits, i.e., on the memory bank BNK0 and BNK3 sides. On the other hand, when seen from the central area of the chip, the data control circuit areas are provided inside, i.e., in areas adjacent to the memory banks BNK1 and BNK2. This data control circuit area includes a circuit for controlling a data path used to transmit signals for data input and output in the longitudinal direction (longitudinal direction) of the chip, and data exchange conducted between a driver (relay amplifier) for driving the data bus, the main amplifier and the write buffer and the DQ interface area. In the case where the data input and output pads are formed in two rows as in this embodiment, the data control circuit areas are disposed inside the DQ interface areas as described above. As a result, the data control circuit areas in the two rows are opposed to each other across the memory array (the memory banks BNK1 and BNK2) without being obstructed by the DQ interface areas. Thus, it becomes possible to lay out data paths in the longitudinal direction more linearly.

Figure 5:
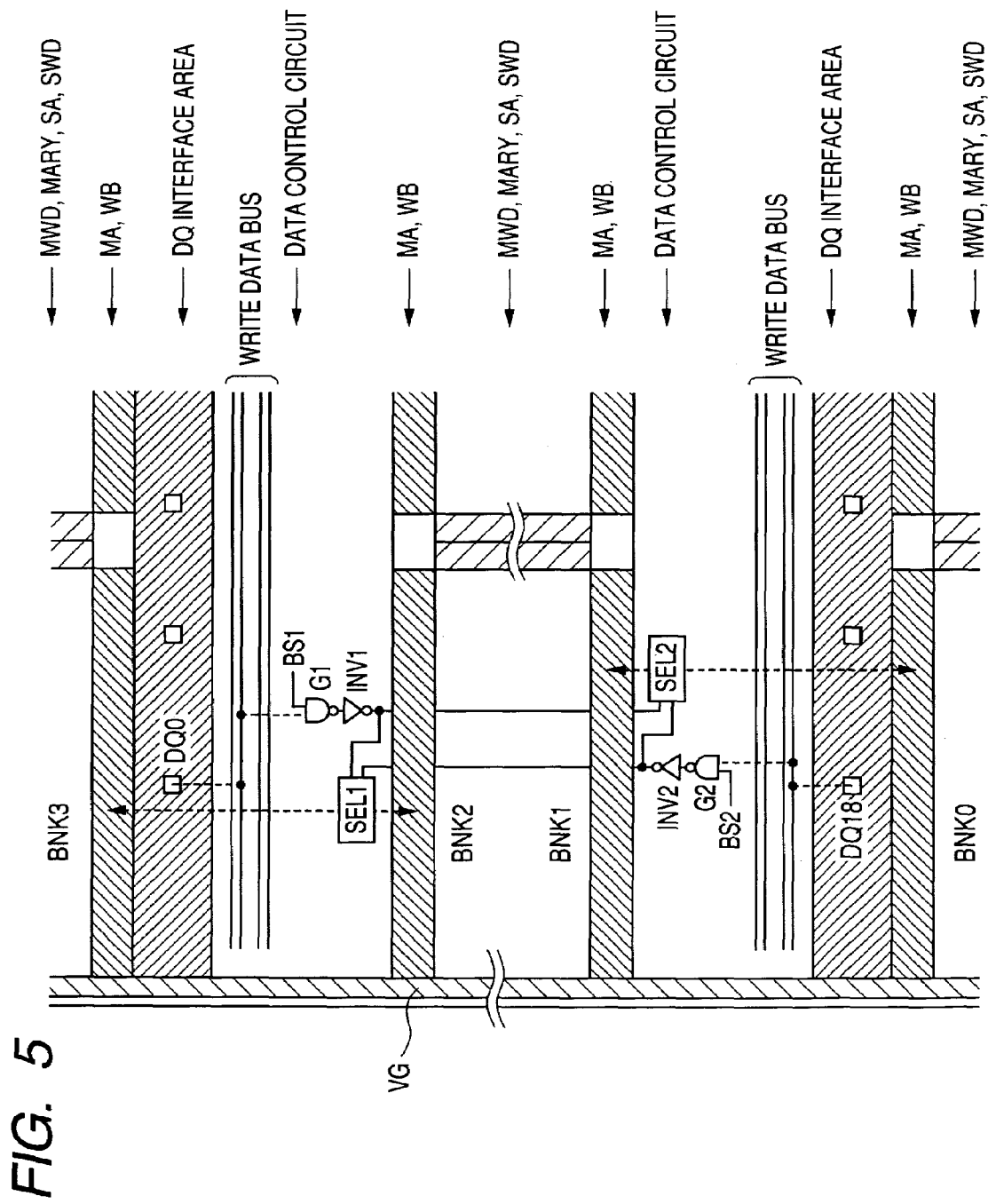
FIG. 5 is a block diagram showing an embodiment of a data control circuit area shown in FIG. 4.

FIG. 5 is a block diagram showing an embodiment of the data control circuit area shown in FIG. 4. Write data buses are exemplified in FIG. 5. A plurality of write data buses extended in the longitudinal direction of the chip are disposed in the data control circuit areas. Write data input from a data input and output pad DQ0 is conveyed to selectors SEL1 and SEL2 via a write data bus, a gate circuit G1 controlled by a band select signal BS1, and an inverter circuit INV1 serving as a driver. Write data input from a data input and output pad DQ18 is conveyed to the selectors SEL1 and SEL2 via a write data bus, a gate circuit G2 controlled by a band select signal BS2, and an inverter circuit INV2 serving as a driver. The selector SEL1 selects data from DQ0 or data from DQ18 according to desired timing, and conveys write data to write buffers WB associated with the memory banks BNK2 and BNK3 as represented by a broken line in FIG. 5. The selector SEL2 conveys write data to write buffers WB associated with the memory banks BNK0 and BNK1 as represented by a broken line in FIG. 5.

Signal routes associated with the gate circuits G1 and G2 and represented by broken lines are paths of data passed through flip-flop circuits (clock-synchronized) from the data input and output pads DQ0 and DQ18 as described above or paths passed through selectors (pair test mode) which are not illustrated. Signal routes associated with the selectors SEL1 and SEL2 and represented by broken lines are data paths in which one is selected by the selectors SEL1 and SEL2 to convey a signal to the write buffer WB. The band select signals BS1 and BS2 respectively supplied to the gate circuits G1 and G2 do not mean selection signals for the memory banks BNK1 and BNK2, but they are selection signals for selecting the four memory banks BNK0 to BNK3. One of the four memory banks BNK0 to BNK3 selected by the bank select signals BS1 and BS2 is selected by another bank select signal which is not illustrated.

Figure 6:
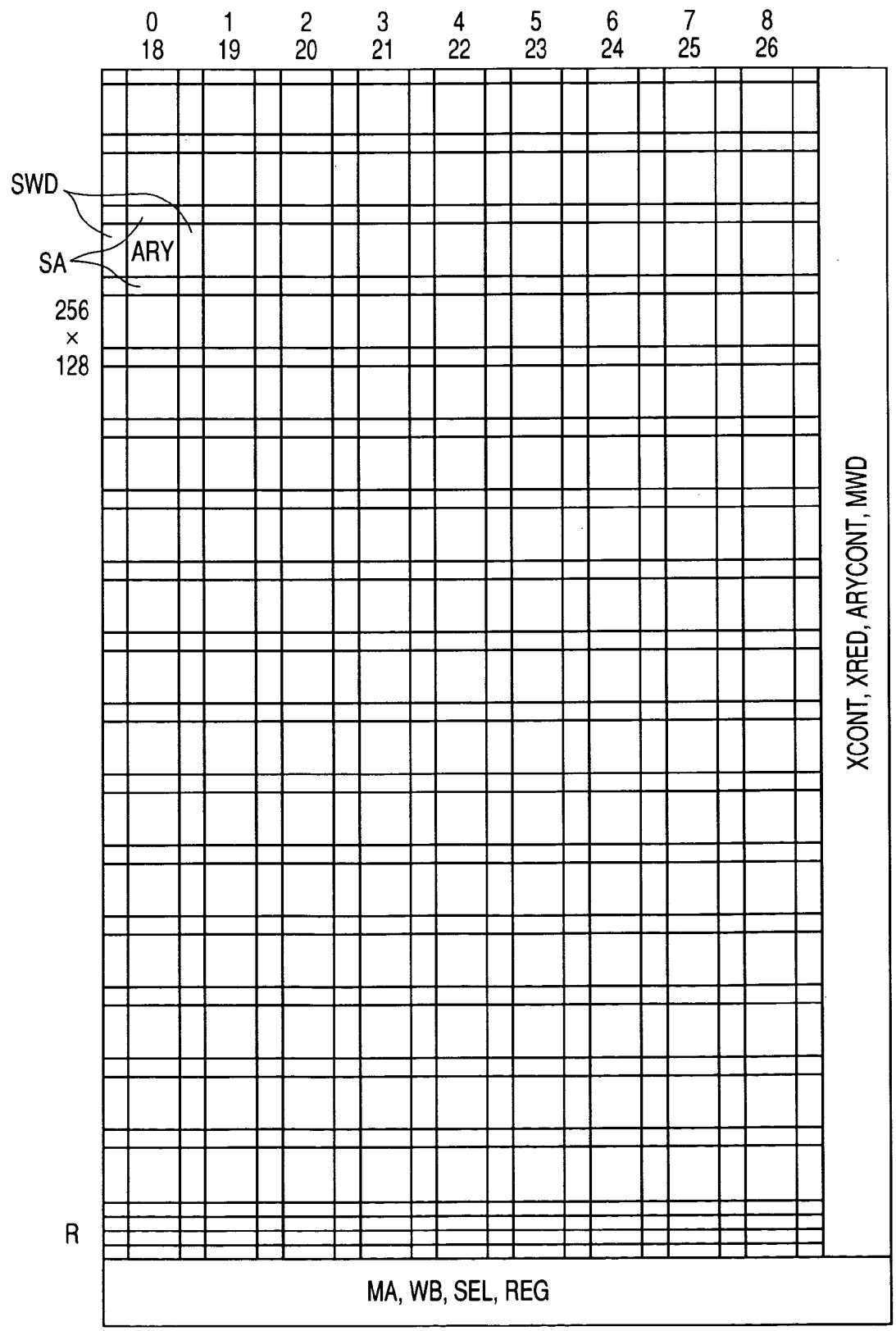
FIG. 6 is a layout diagram showing an embodiment of a memory bank shown in FIG. 1.

FIG. 6 is a layout diagram showing an embodiment of the memory bank. The memory array is divided into a plurality of subarrays ARY. Each subarray ARY is defined by the sense amplifier areas SA and sub word decoder areas SWD. Cross sections of the sense amplifier areas SA and the sub word decoder areas SWD are referred to as cross areas or intersections. Sense amplifiers provided in the sense amplifier areas SA are formed by using the shared sense technique. Except sense amplifiers SA disposed at both ends of the subarrays ARY, complementary bit lines are provided on the right and the left of each sense amplifier SA, and selectively connected to complementary bit lines of the left or right subarray ARY.

For the memory array, a row address control circuit XCONT, a row address redundant circuit XRED, an array control circuit ARYCONT, and a main word decoder MWD are provided in the main word decoder area shown in FIG. 3. The main word decoder forms a selection signal for a main word line extended so as to penetrate a plurality of subarrays defined by the sub word decoders SWD. An X decoder and a driver for forming a sub word selection signal are also provided in the main word driver, and they are extended in parallel to the main word line to form a sub word selection line signal. Furthermore, a main amplifier MA, a write buffer WB, a selector SEL, and a register REG are provided in the main amplifier area shown in FIG. 3. R denotes a redundant subarray.

When conducting data inputting and outputting by taking 36 bits at maximum as the unit as described above, one memory bank BNK0 is bisected as described. Therefore, it becomes necessary to conduct inputting and outputting with a 18-bit structure. Therefore, the memory array is divided into nine areas in the word line direction, and nine subarrays are provided. As described later, two pairs of local input and output lines for data inputting and data outputting are disposed along sense amplifiers SA of each subarray ARY, and connected to the main amplifier MA and the write buffer WB by input and output lines extended over the array ARY in the bit line direction. For example, in a subarray column at the left end shown in FIG. 6, two pairs of input and output lines for data inputting and data outputting directed to data input and output pads 0 and 18 are provided as represented by numerals in FIG. 6.

Figure 7:
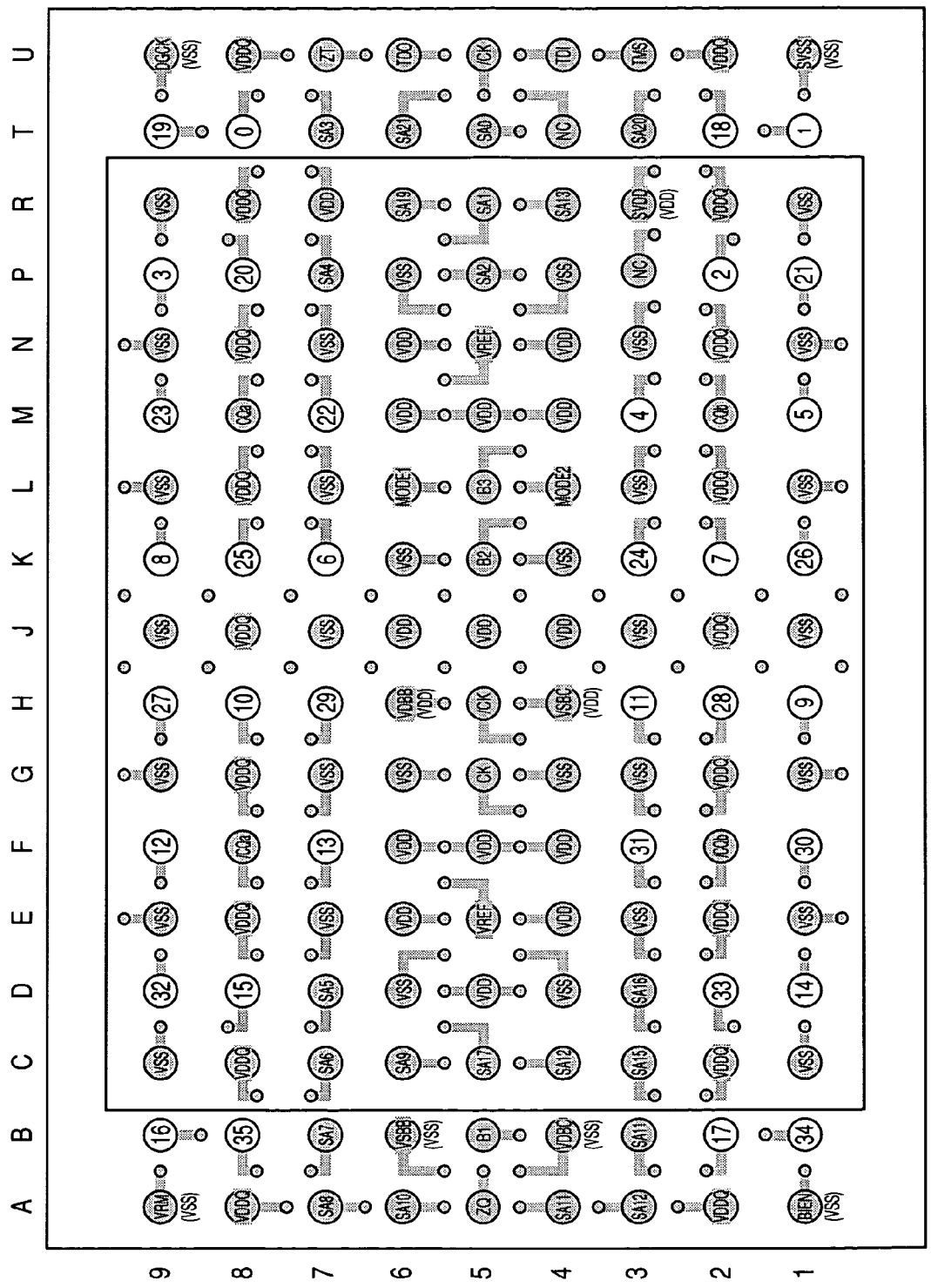
FIG. 7 is a package diagram showing an embodiment of a semiconductor memory device according to the present invention.

FIG. 7 is a package diagram showing an embodiment of a semiconductor memory device according to the present invention. In this embodiment, dynamic memory cells are used as described above. As for the package, the semiconductor memory device in this embodiment is based on the SRAM. In other words, the DRAM in this embodiment is a pseudo SRAM which can replace an SRAM. In the FCBGA package which is a standard SRAM package, data input and output terminals are arranged as denoted by numerals 1 to 35 in FIG. 7, although not especially limited. As shown in FIG. 7, terminals other than the data input and output terminals, such as an internal power supply voltage VDD, a ground potential VSS, a clock CLK, and a reference voltage VRF are disposed in a central area with respect to the longitudinal direction of the chip. Data input terminals are disposed on both sides so as to sandwich them between. As a result, matching with the two-row arrangement of the data input and output pads in the embodiment shown in FIG. 1 is good, and it is possible to connect the terminals to solder bolls serving as the external terminals by short wiring.

Figure 8:
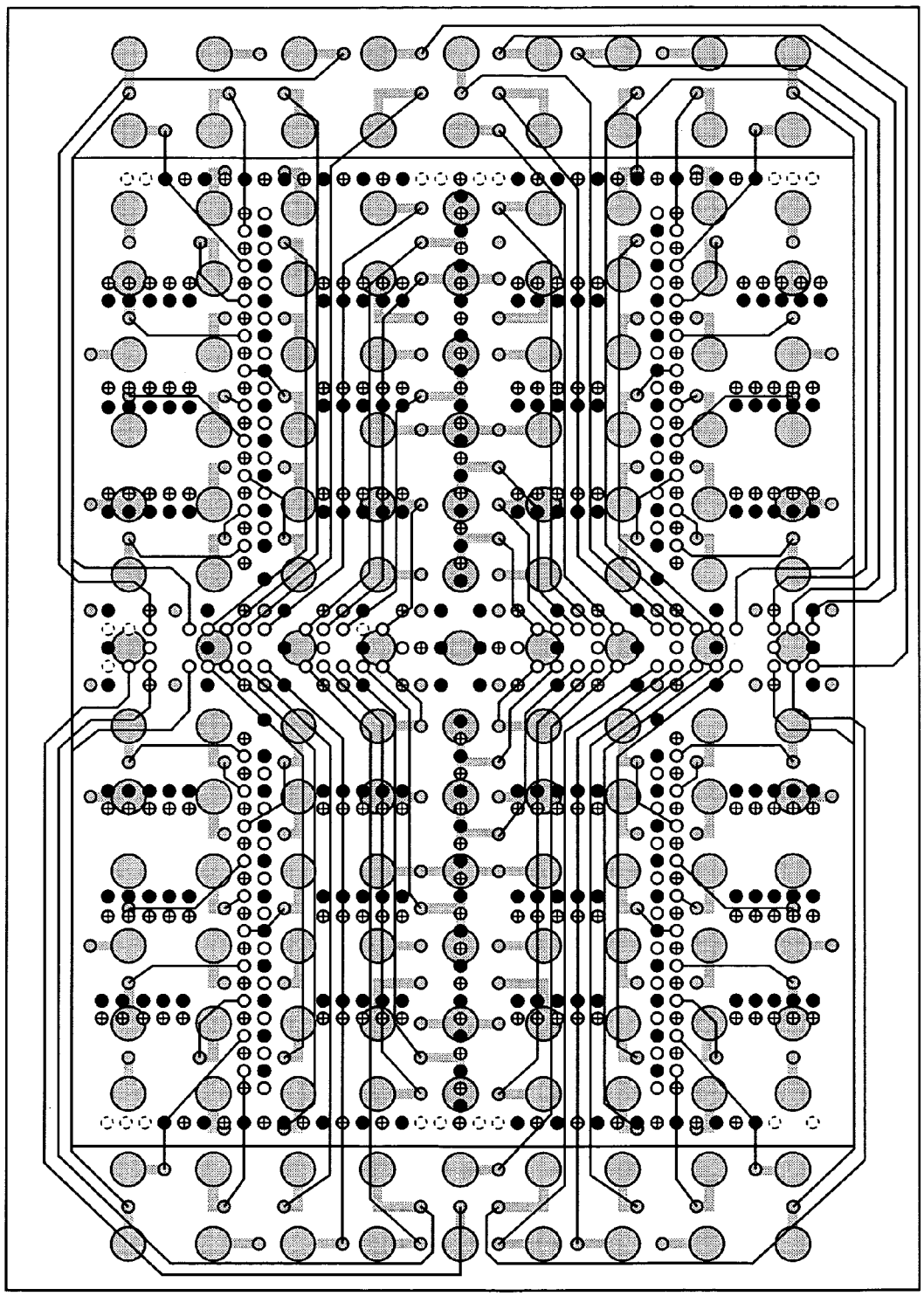
FIG. 8 is a package diagram showing an embodiment of a semiconductor memory device according to the present invention.

FIG. 8 is a package diagram showing an embodiment of a semiconductor memory device according to the present invention. The data input and output pads 0 to 35 of the semiconductor chip shown in FIG. 7, signal lines connected between the data input and output pads 0 to 35 and solder bolls serving as data input and output terminals, signal lines such as address signal lines, and test signal lines are exemplified in FIG. 8. FIG. 8 has the same pattern as that shown in FIG. 7. The data input and output terminals are arranged as indicated by the numerals 1 to 35. In FIG. 8, identifications of external terminals respectively formed of solder bolls are not definite. By superposing FIG. 8 on FIG. 7, however, it is possible to distinguish signal lines between the data input and output pads 0 to 35 and solder bolls serving as data input and output terminals connected to the data input and output pads. FIG. 8 is shown to describe the matching to the two-row arrangement of the data input and output pads as described with reference to the embodiment shown in FIG. 1. Therefore, the remaining configuration will be described only to an extent that its rough state can be understood.

Figure 9:
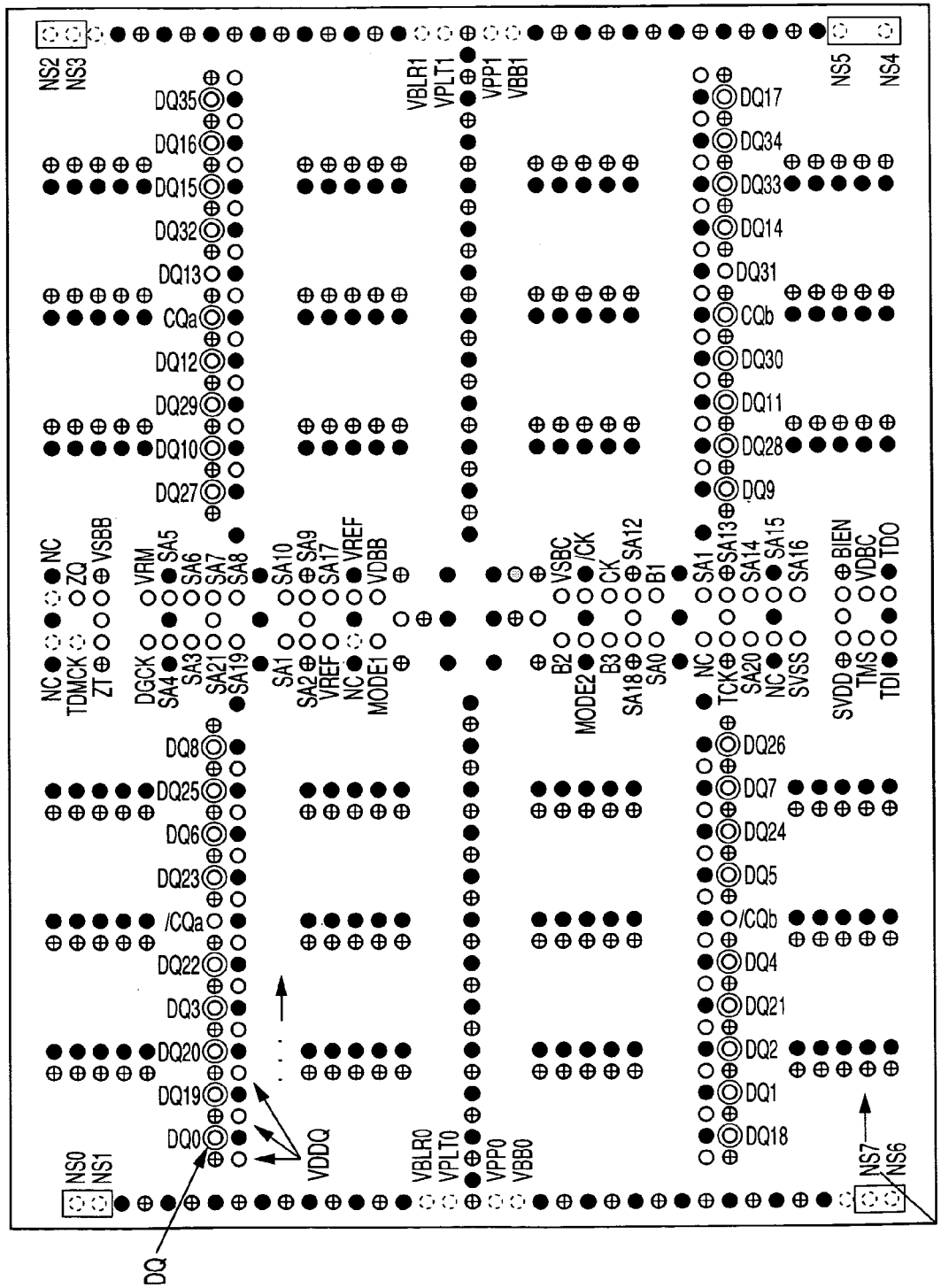
FIG. 9 is a package diagram showing an embodiment of a semiconductor memory device according to the present invention.

FIG. 9 is a pad arrangement diagram in an embodiment of a semiconductor memory device according to the present invention. In FIG. 9, the data input and output pads 0 to 35 shown in FIG. 1 are emphasized with "o" symbol to represent their locations. As shown in FIG. 9, the data input and output pads 0 to 35 are arranged in two rows in the longitudinal direction so as to be associated with the layout shown in FIG. 1. As for other pads, black circles represent VSS, and white circles represent signal terminals and internal power supply terminals VDDQ. White circles having "+" sign therein represent VDD terminals. Along the peripheral circuit shown in FIG. 1, address terminals such as SA0 to SA21 and clock terminals are arranged in the central area of the chip in the lateral direction.

FIG. 10 is a package diagram showing another embodiment of a semiconductor memory device according to the present invention. In this embodiment, a 54-pin plastic TSOP (II) package is used. In other words, the semiconductor memory device is not mounted on an SRAM package, but mounted on a standard package for DRAM. As for data terminals, the semiconductor memory device has a 16-bit configuration of DQ0 to DQ15. Therefore, it is necessary to be able to input to and output from the memory bank by taking 16 bits as the unit.

FIG. 11 is a package diagram showing still another embodiment of a semiconductor memory device according to the present invention. In this embodiment, a 90-boll FBGA package is used. In other words, the semiconductor memory device is not mounted on an SRAM package, but mounted on a standard package for DRAM. As for data terminals, the semiconductor memory device has a 32-bit configuration of DQ0 to DQ31. Therefore, it is necessary to be able to input to and output from the memory bank by taking 32 bits as the unit.

Figure 12:
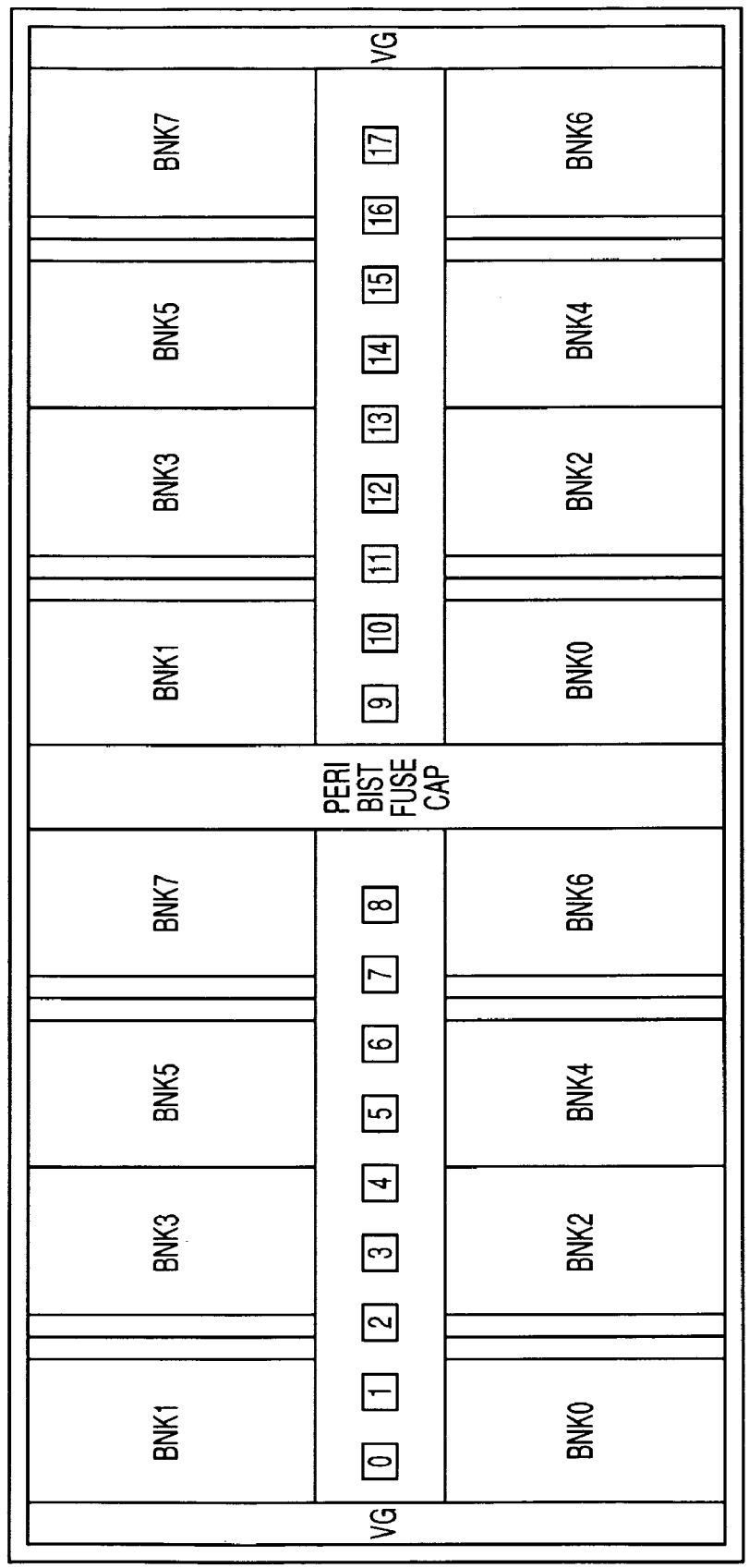
FIG. 12 is a schematic layout diagram showing another embodiment of a semiconductor memory device according to the present invention.

FIG. 12 is a schematic layout diagram showing another embodiment of a semiconductor memory device according to the present invention. In this embodiment, eight memory banks BNK0 to BNK7 are provided. A peripheral circuit area represented by a peripheral circuit PER1 is provided in a central part with respect to the longitudinal direction of the semiconductor chip. The semiconductor chip is bisected by such a peripheral circuit area. The memory banks BNK0 to BNK7 are disposed on each of areas obtained by bisecting the semiconductor chip. Along the longitudinal direction of the semiconductor chip, a row of pads 0 to 17 is disposed in a central area with respect to the lateral direction. In other words, one memory bank BNK0 includes two memory banks BNK0 disposed on both sides of the peripheral circuit area. Paying attention to the memory bank BNK0 in this configuration as well, signal routes respectively leading from the memory banks BNK0 provided in the two areas bisected in the longitudinal direction of the chip to the data input and output pads 8 and 17 are formed. Thus, the length of the signal routes can be shortened to approximately half as compared with the case where the memory banks are not bisected. The number of pads may be sixteen as represented by 0 to 15, besides eighteen as described above.

Figure 13:
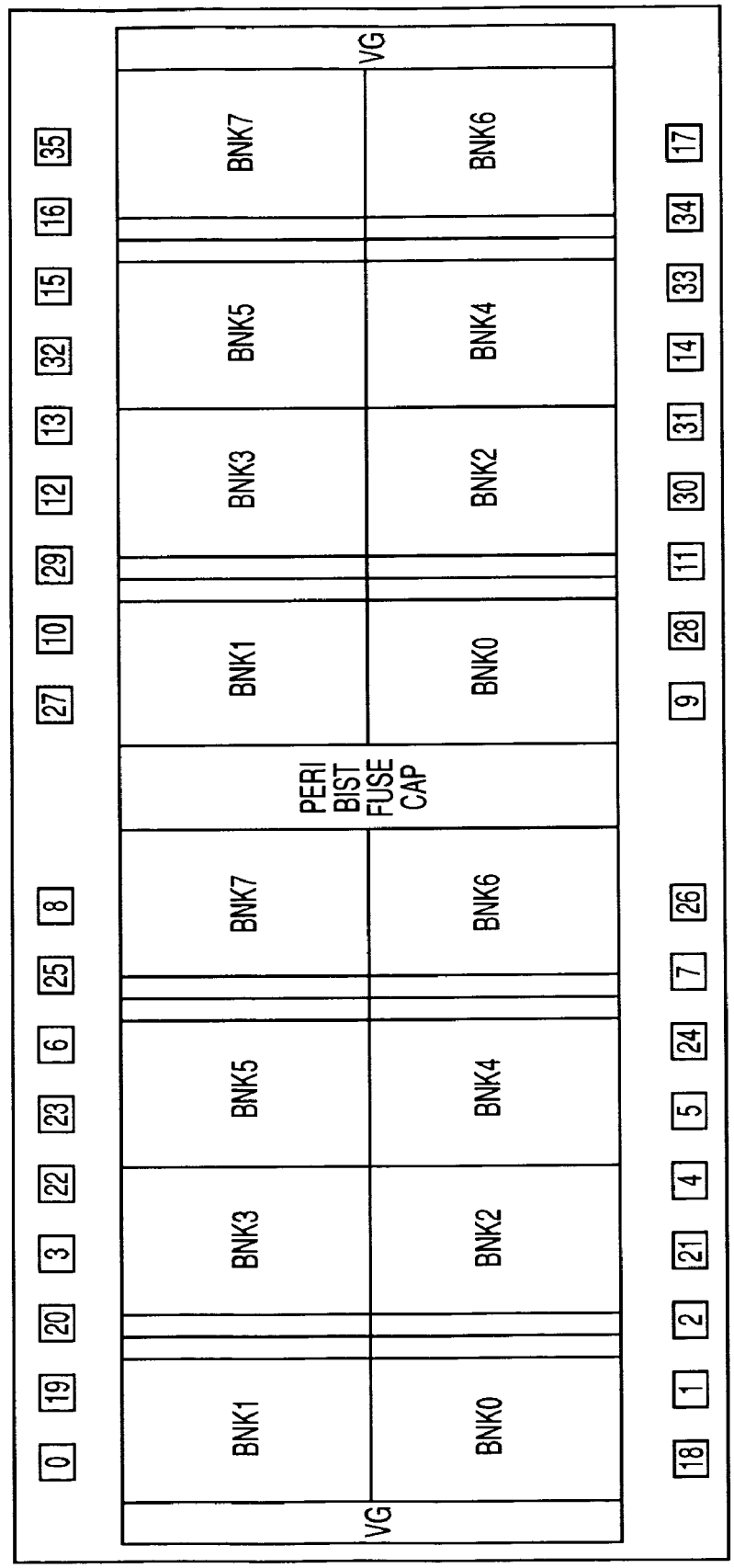
FIG. 13 is a schematic layout diagram showing another embodiment of a semiconductor memory device according to the present invention.

FIG. 13 is a schematic layout diagram showing another embodiment of a semiconductor memory device according to the present invention. In this embodiment, eight memory banks BNK0 to BNK7 are provided. A peripheral circuit area represented by a peripheral circuit PER1 is provided in a central part with respect to a longitudinal direction of the semiconductor chip. The semiconductor chip is bisected by such a peripheral circuit area. The memory banks BNK0 to BNK7 are disposed on each of areas obtained by bisecting the semiconductor chip. And the semiconductor chip is bisected by a central area with respect to a lateral direction of the semiconductor chip, and two rows respectively including the memory banks BNK0 and BNK1 are arranged. Along the longitudinal direction of the semiconductor chip, data input and output pads 0 to 35 are disposed on both sides with respect to the lateral direction of the semiconductor chip distributively in the same way as FIG. 1. Paying attention to the memory bank BNK0 in this configuration as well, signal routes respectively leading from the memory banks BNK0 provided in the two areas bisected in the longitudinal direction of the chip to the data input and output pads 8 and 17 are formed. Thus, the length of the signal routes can be shortened to approximately half as compared with the case where the memory banks are not bisected.

Figure 14:
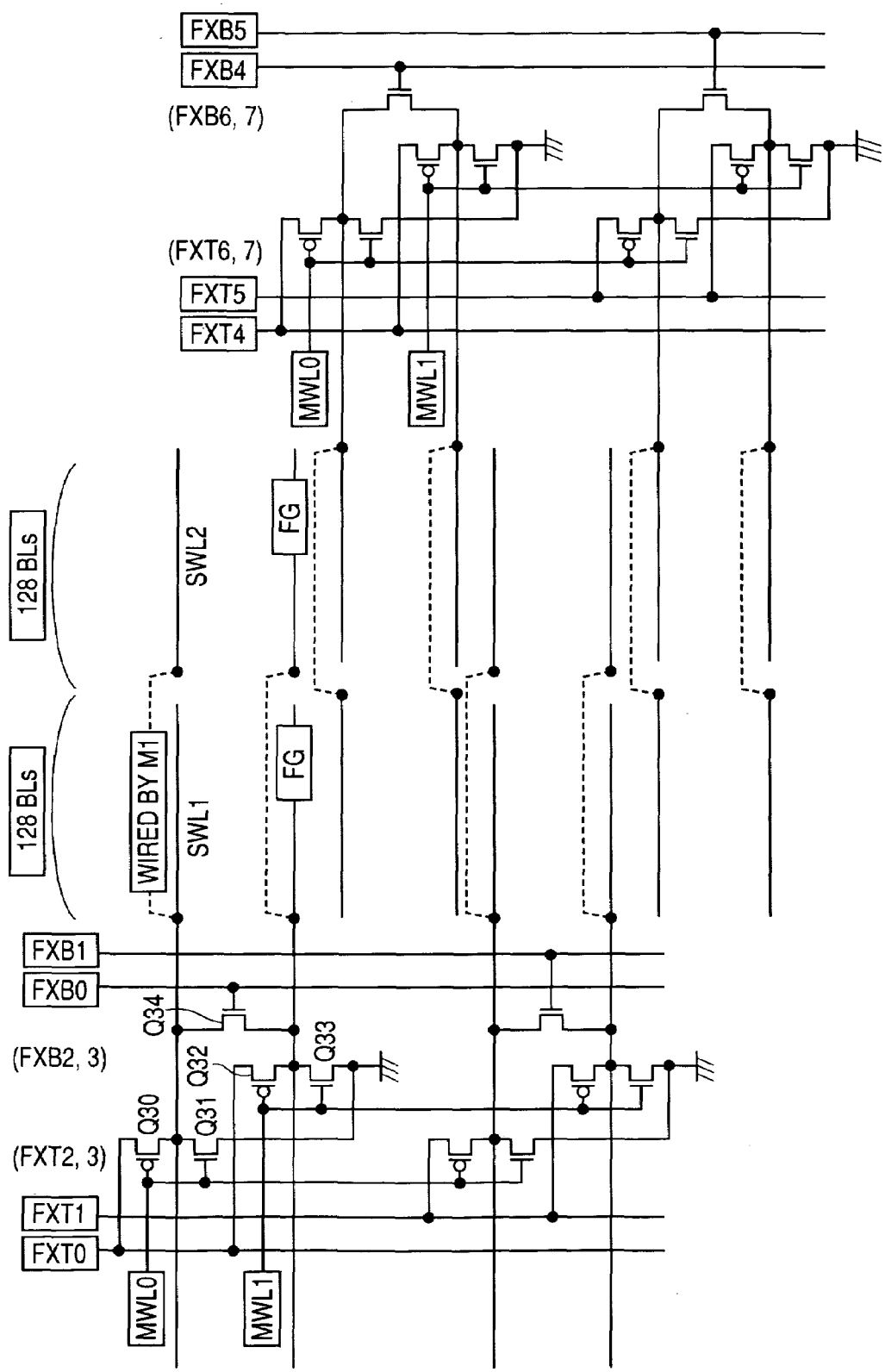
FIG. 14 is a circuit diagram showing an embodiment of a subarray shown in FIG. 6.

FIG. 14 is a circuit diagram showing an embodiment of a subarray shown in FIG. 6. Although not especially limited, eight sub word drivers are provided for each of main word lines MWL0 and MWL1. Thus, a total of sixteen sub word drivers are provided. In FIG. 14, a total of eight sub word drivers, i.e., four sub word drivers associated with FX0 and FX1, and four sub word drivers associated with FX4 and FX5 are exemplified. For example, two sub word drivers associated with the main word lines MWL0 and MWL1 and FX0 include MOSFETs Q30 to Q34. In FIG. 14, a MOSFET having "o" symbol at its gate to represent inversion is a P-channel MOSFET. The P-channel MOSFET is distinguished from N-channel MOSFETs on the basis of such a symbol.

A P-channel MOSFET Q30 and an N-channel MOSFET Q31 constitute a CMOS inverter circuit. Gates of the MOSFETs Q30 and Q31 are connected to the main word line MWL0. In the same way, a P-channel MOSFET Q32 and an N-channel MOSFET Q33 constitute a CMOS inverter circuit. Gates of the MOSFETs Q32 and Q32 are connected to the main word line MWL1. Drains of the P-channel MOSFETs Q30 and Q32 in the two sub word drivers, i.e., operation voltage terminals in the CMOS inverter circuits are supplied with a word line selection signal FXT0 in common.

An N-channel MOSFET Q34 is provided between output terminals of the two sub word drivers, and its gate is supplied with a word line selection signal FXB0. In the same way, three pairs of (a total of six) similar sub word drivers are provided respectively for the word line selection signals FXT1, FX4 and FX5 so as to be connected to the main word lines MWL0 and MWL1 in common. Eight remaining sub word drivers associated with word line selection signals FX2 and FX3 and FX6 and FX7 are omitted.

An output terminal of the sub word driver formed of the MOSFETs Q30 and Q31 is connected to an end of a first sub word line SWL1 formed of an FG layer. The other end of the first sub word line SWL1 is extended to an intermediate area of the cell array and terminated. Therefore, 256 pairs of bit lines BL are provided in the cell array as described above. The first sub word line SWL1 is disposed so as to intersect 128 pairs of bit lines, i.e., half of the 256 pairs. Therefore, 128 memory cells are connected to the first sub word line SWL1.

The output terminal of the sub word driver is extended in parallel to the first sub word line SWL1, and connected to one end of M1 wiring. The other end of the M1 wiring is connected to one end of a second sub word line SWL2 extended in the extension direction of the first sub word line SWL1. The second sub word line SWL2 is formed of the FG layer in the same way as the first sub word line SWL1. The second sub word line SWL2 is disposed so as to extend from the intermediate area of the cell array as far as an end of the cell array opposite to the sub word driver and intersect the remaining half, i.e., 128 pairs of bit lines. Therefore, 128 memory cells are connected to the second sub word line SWL2 as well.

Since the first sub word line SWL1 and the second sub word line SWL2 are connected to each other via the M1 wiring, it is possible to bring 256 memory cells into the selected state by using one sub word driver. Since the M1 wiring can be made lower in resistance than the sub word line SWL1 formed of the FG layer, however, a memory cell located in a remote end area of the sub word line SWL1 can be made substantially equal in selection delay time to a memory cell located in a remote end area of the sub word line SWL2 by providing the sub word driver with sufficient current drivability.

In other words, as compared with delay time spent to select a memory cell located in a remote end area when 256 memory cells are connected to a sub word line formed of the FG layer, delay time spent to select memory cells respectively located in remote end areas respectively of two sub word lines SWL1 and SWL2 each having 128 memory cells connected thereto can be reduced to half if the output impedance of the sub word driver is neglected. If high speed operation is given priority, it is also possible to use one sub word line SWL1 by omitting the sub word line SWL2 and reduce the number of memory cells to, for example, 128.

Selection operation of the sub word lines SWL1 and SWL2 will now be described. When the main word line MWL0 is in the low level selection state and the word line selection signal FXT0 is in the high level selection state, the P-channel MOSFET Q30 turns on and conveys the high level in the word line selection signal FXT0 to the sub word lines SWL1 and SWL2. In a sub word driver associated with the unselected main word line MWL1, the N-channel MOSFET Q33 turns on and brings the sub word line to an unselected low level. At this time, the MOSFET Q34 is in the off-state because of the low level at the FXB0. When the word line selection signal FXT0 is in the high level selection state, the main word line MWL0 is at the non-selection high level, and the main word line MWL1 is at the selection low level, the adjacent sub word line is selected.

When the main word line MWL0 is in the low level selection state and the word line selection signal FXT0 is in the low level non-selection state, the P-channel MOSFET Q30 turns on. However, the threshold voltage of the P-channel MOSFET Q30 remains in the word line selection signal FXT0, and the word line selection signal FXT0 cannot be brought to the low level such as the ground potential. At this time, the MOSFET Q34 is in the on-state because of the high level at the FXB0. A low level formed by the on-state of the N-channel MOSFET Q33 in the sub word driver associated with the unselected main word line MWL1 is conveyed to the sub word lines SWL1 and SWL2. At this time, another sub word line is brought into the selected state by any one of the word line selection signals FX1 (FXT1, FXB1) to FX7 (FXT7, FXB7).

Figure 15:
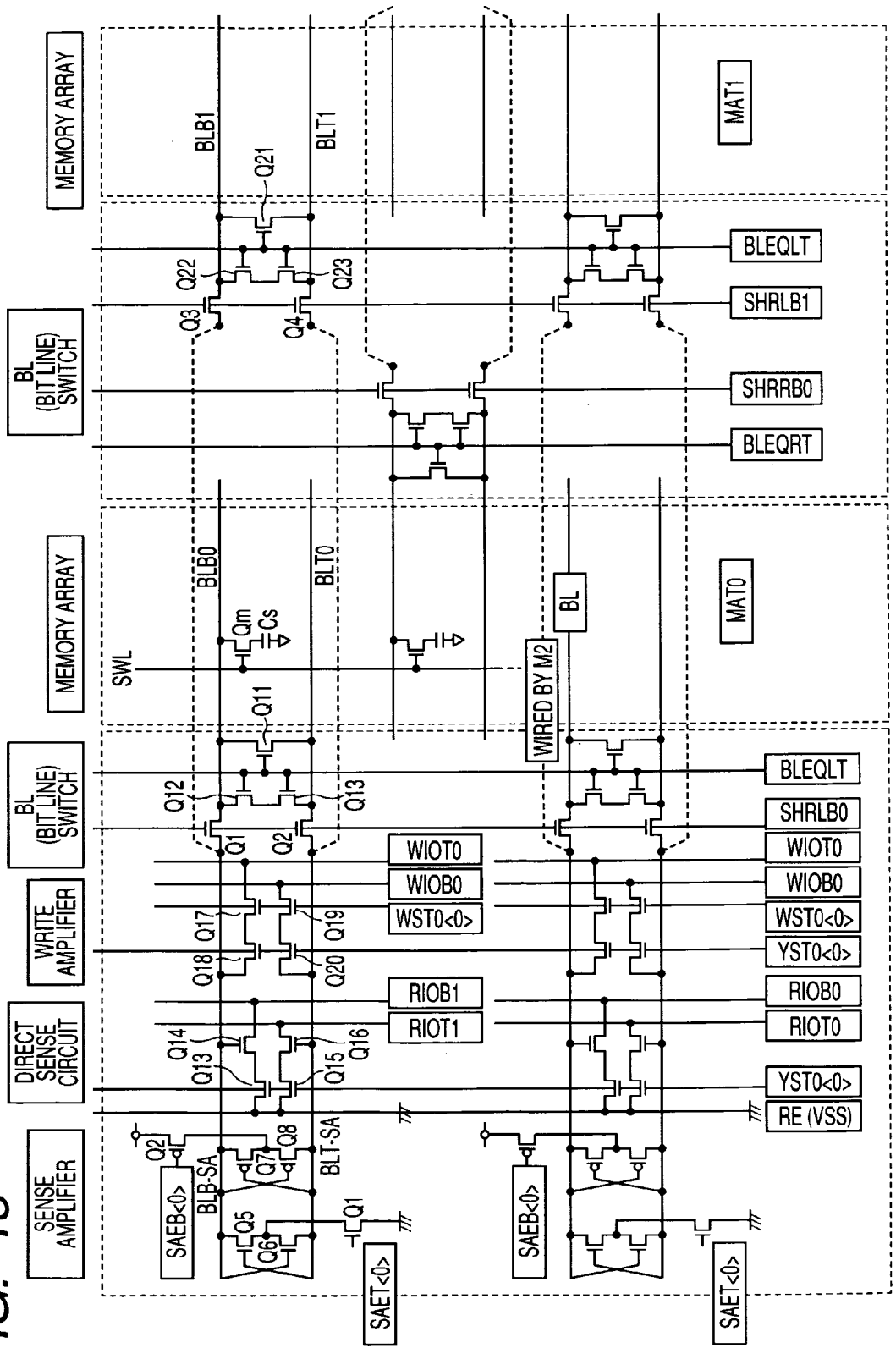
FIG. 15 is a circuit diagram showing an embodiment of a subarray shown in FIG. 6.

FIG. 15 is a circuit diagram showing an embodiment of a subarray shown in FIG. 6. Two sense amplifiers, and a bit line pair, a precharge circuit, a read system circuit and a write system circuit associated with the two sense amplifiers are exemplified in FIG. 15 as representative ones. In this embodiment, a subarray is divided into two memory mats (arrays) MAT0 and MAT1, although not especially restricted. As exemplified in the memory mat MAT0, a dynamic memory cell includes an address selection MOSFET Qm and a memory capacitor Cs. The address selection MOSFET Qm is connected at its gate to a sub word line SWL0 as described above. The MOSFET Qm is connected at one of its source and drain to a bit line BLB0 included in a bit line pair, and connected at the other of its source and drain to a storage node of the information memory capacitor Cs. The other electrode of the information memory capacitor Cs is supplied in common with a plate voltage.

As described above, the subarray is divided into two memory mats MAT0 and MAT1. As shown in FIG. 15, bit lines BLB0 and BLT0, and BLB1 and BLT1 are disposed in parallel to MAT0 and MAT1, respectively. The complementary bit lines BLB0 and BLT0 of the memory mat MAT0 disposed near the sense amplifier are connected to input and output nodes BLB-SA and BLT-SA of the sense amplifier by shared switches (or BL switches) MOSFETs Q1 and Q2, respectively. Shared switches (or BL switches) MOSFETs Q3 and Q4 provided for complementary bit lines BLB1 and BLT1 of the memory mat MAT1 disposed away from the sense amplifier are connected to the input and output nodes BLB-SA and BLT-SA of the sense amplifier via M2 wiring extended in parallel to the complementary bit lines BLB0 and BLT0, respectively. In other words, the subarray is divided into two memory mats MAT0 and MAT1 by the BL switch areas provided in central areas in the bit line direction.

A unit circuit included in the sense amplifier is a CMOS latch circuit including N-channel MOSFETs Q5 and Q6 and P-channel MOSFETs Q7 and Q8 which are cross-connected at their gates and drains to form latch circuits. Sources of the N-channel MOSFETs Q5 and Q6 are supplied with a ground potential via a sense amplifier activation MOSFET Q1. Sources of the P-channel MOSFETs Q7 and Q8 are supplied with an operation voltage via a sense amplifier activation MOSFET Q2.

The sense amplifier activation MOSFET Q2 is supplied at its gate with a sense amplifier activation signal SAEB. The sense amplifier activation MOSFET Q2 is turned on in synchronism with a low level in the signal SAEB to supply the operation voltage to the sources of the P-channel MOSFETs Q7 and Q8. The MOSFET Q1 is supplied at its gate with a sense amplifier activation signal SAET. The sense amplifier activation MOSFET Q1 is turned on in synchronism with a high level in the signal SAET to supply the ground potential of the circuit to the sources of the N-channel MOSFETs Q5 and Q6.

In an alternative configuration, the sources of the N-channel MOSFETs Q5 and Q6 are connected in common to sources of similar MOSFETs in other sense amplifiers, and the sense amplifier activation MOSFET Q1 is provided in common to a plurality of sense amplifiers to supply the ground potential. And in the alternative configuration, the sources of the P-channel MOSFETs Q7 and Q8 are connected in common to sources of similar MOSFETs in other sense amplifiers, and the sense amplifier activation MOSFET Q2 is provided in common to a plurality of sense amplifiers to supply the operation voltage.

A direct sense circuit forming a read system circuit and a write amplifier circuit forming a write system circuit are connected between the input and output nodes BLB-SA and BLT-SA of the sense amplifier. The direct sense circuit includes N-channel MOSFETs Q13 to Q16. The write amplifier circuit includes N-channel MOSFETs Q17 to Q20.

The direct sense circuit includes amplification MOSFETs Q14 and Q16 having gates respectively connected to the input and output nodes BLB-SA and BLT-SA of the sense amplifier, and MOSFETs Q13 and Q15 connected at their gates to a column selection line YST0<0> and connected respectively in series to the MOSFETs Q14 and Q16. The amplification MOSFET Q14 is connected at its drain to a complementary read signal line (local input and output line) RIOB1, and the amplification MOSFET Q16 is connected at its drain to a read signal line (local input and output line) RIOT1. Sources of the MOSFETs Q13 and Q15 are supplied with the ground potential of the circuit.

The write amplifier circuit includes a series circuit of MOSFETs Q17 and Q18 and a series circuit of MOSFETs Q19 and Q20 provided between the input and output nodes BLB-SA and BLT-SA of the sense amplifier and complementary write signal lines WIOB1 and WIOT1. Gates of the MOSFETs Q18 and Q20 serving as column switches are connected to the column selection line YST0. Gates of the MOSFETs Q17 and Q19 are connected to an operation timing signal line WST0<0>.

The sense amplifier in this embodiment is a so-called shared sense amplifier in which two pairs of complementary bit lines of each of the left and right subarrays are provided for the input and output nodes BLB-SA and BLT-SA. In other words, in one of subarrays exemplified in FIG. 15, the input and output nodes BLB-SA and BLT-SA are connected to the bit lines BLB0 and BLT0 located nearer via the shared switches MOSFETs Q1 and Q2, and connected to the bit lines BLB1 and BLT1 located farther away via the M2 wiring and the shared switches MOSFETs Q3 and Q4.

In this embodiment, gates of the shared switches MOSFETs Q1 and Q2 and Q3 and Q4 are supplied with selection signals SHRLB0 and SHRLB1, respectively. Selection levels in the selection signals SHRLB0 and SHRLB1 are made high levels such as the boosted voltage in the same way as the selection level on the sub word line SWL. A similar subarray is provided for the other of the sense amplifiers as well. Furthermore, sense amplifiers are disposed on both sides of the subarray in the bit line direction. Bit lines adjacent to the bit lines BLB0, BLT0, BLB1 and BLT1 are connected to a sense amplifier which is adjacent to the memory mat MAT1 and which is not illustrated.

For the first complementary bit lines BLB0 and BLT0, a precharge circuit is provided. The precharge circuit includes switches MOSFETs Q12 and Q13 to supply a half precharge voltage which is not illustrated, and a MOSFETs Q11 to shortcircuit BLB0 to BLT0. Gates of these MOSFETs Q11 to Q13 are supplied in common with a precharge signal BLEQLT. For the second complementary bit lines BLB1 and BLT1 as well, a precharge circuit is provided. The precharge circuit includes switches MOSFETs Q22 and Q23 to supply a half precharge voltage which is not illustrated, and a MOSFETs Q21 to shortcircuit BLB1 to BLT1. Gates of these MOSFETs Q21 to Q23 are supplied in common with a precharge signal BLEQLT.

When the MAT0 in the subarray is selected, the MOSFETs Q1 and Q2 maintain the on-state according to the signal SHRLB0, and the signal SHRLB1 is set to a low level to disconnect the bit lines BLB1 and BLT1 for the memory mat MAT1. Bit lines of the other subarray are also disconnected in the same way. When the memory mat MAT1 is selected, the MOSFETs Q3 and Q4 maintain the on-state according to the signal SHRLB1, and the signal SHRLB0 is set to a low level to disconnect the bit lines BLB0 and BLT0 for the memory mat MAT0. In a precharge interval after the memory access is finished, the signals SHRLB0 and SHRLB1 and the signals associated with the other subarray are at the high level. In this precharge interval, precharging of the bit lines is conducted according to the signal BLEQLT.

In this embodiment, bit lines connected at the time of amplification in the sense amplifier become only either the bit lines BLB0 and BLT0 or the bit lines BLB1 and BLT1 in the subarray selected according to the selection operation as described above. As a result, the number of memory cells connected to the selected bit lines can be reduced to half such as 128. Therefore, the parasitic capacitance on the bit lines decreases, and the capacitance ratio between the parasitic capacitance and the memory capacitor Cs in each memory cell can be made small. In other words, a change quantity for a precharge potential on bit lines associated with information charge across the memory capacitor Cs can be made large. As a result, the signal quantity input to the sense amplifier increases, and it is possible to raise the speed of the sense amplifier and reduce the power dissipation.

If the number of memory cells connected to the bit lines is reduced to, for example, 128, it is possible to raise the speed of the sense amplifier and reduce the power dissipation in the same way as the foregoing description. However, the number of divisions in the cell array increases, and the number of sense amplifiers provided in the bit line direction increase to as many as twice. As a result, the area of the whole subarray increases. In this embodiment, bit lines formed of the BL layers are cut off in the intermediate area of the cell array, and the bit lines disposed father from the sense amplifier are connected to the sense amplifier by using the low-resistance M2 wiring disposed in parallel to the bit lines disposed near the sense amplifier. As a result, the number of memory cells connected to the sense amplifier can be reduced to half as described above, resulting in high integration.

Each memory bank in this embodiment includes X and Y address buffers or address latches as represented by the register REG. As a result, it is possible to supply an address to one memory bank and irrespective of the memory operation, supply an address to a different memory bank in succession. In other words, in DRAMs, it takes a time since an address is input until data is taken out. Therefore, the time spent for read operation in each memory bank can be made apparently zero by conducting memory access to a plurality of memory banks in a pipeline form.

Owing to the pipeline operation as described above and mounting on a package based on the SRAM as described above, the DRAM can be used as a cache memory. In other words, in the DRAM, the memory capacity can be increased to approximately four times as compared with the SRAM. On the other hand, the memory access time is prolonged to approximately four times. However, the hit rate of cache can be made remarkably high because of an increase in memory capacity. As for the operation speed as a whole with due regard to mishit caused when using the SRAM, the use of the DRAM according to the present invention becomes more favorable in many cases. Especially in microcomputers which conduct signal processing of a comparatively small capacity, the use of the DRAM according to the present invention becomes more favorable.

Heretofore, the invention achieved by the present inventor has been described specifically on the basis of the embodiments. However, the present invention is not restricted to the embodiments, but various changes can be made without departing from the spirit of the invention. For example, the memory cells may be static memory cells besides dynamic memory cells. In other words, according to the present invention, a higher speed is implemented in a multibank structure by shortening the signal transmission route between a memory bank and a data input and output pad. Therefore, the present invention can be applied to the SRAMs as well in the same way. As for the bank structure, various embodiments such as eight or sixteen memory banks can be adopted. Furthermore, a control circuit required to constitute a cache memory may be incorporated. The present invention can be widely used as a semiconductor memory device and a semiconductor device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor memory device comprising:
a plurality of data terminal pads;
a plurality of memory banks independently subject to memory access; and
a peripheral circuit which extends substantially across a semiconductor chip in a first direction,
wherein each of the memory banks is divided into a plurality of submemory banks, including a submemory bank disposed to a first side of the peripheral circuit and a submemory bank disposed to a second side of the peripheral circuit,
said submemory bank disposed to the first side of the peripheral circuit can output data to a portion of the plurality of data terminal pads disposed to the first side of the peripheral circuit, and
said submemory bank disposed to the second side of the peripheral circuit can output data to a portion of the plurality of data terminal pads disposed to the second side of the peripheral circuit.

2. The semiconductor memory device according to claim 1, further comprising a central portion which extends substantially across the semiconductor chip in a second direction,
wherein said central portion is taken as a boundary, and
in each of first and second semiconductor areas to opposite sides of said central area, a number of data terminal pads are arranged side by side in the second direction.

3. The semiconductor memory device according to claim 2, wherein, as for the data terminal pads, pads associated with a bus width of total N bits are divided in the second direction into pads associated with upper bits and pads associated with lower bits, and
the pads associated with upper bits and the pads associated with lower bits are respectively distributed uniformly in the first direction.

4. The semiconductor memory device according to claim 3, further comprising pads associated with a bus width of upper N bits,
wherein in the same way as the bus width of total N bits, the pads associated with a bus width of upper N bits are arranged so as to be divided in the second direction into pads associated with upper bits and pads associated with lower bits, and
the pads associated with upper bits and the pads associated with lower bits are respectively distributed uniformly in the first direction.

5. The semiconductor memory device according to claim 2, wherein each of the memory banks is formed with dynamic memory cells, and
the semiconductor chip is mounted on a package associated with a static RAM.

6. The semiconductor memory device according to claim 5, wherein submemory banks in the first semiconductor area include a submemory bank that has a data transmission route passing over other submemory banks and leading to a data terminal pad formed on the second semiconductor area.

7. The semiconductor memory device according to claim 6, wherein, in each of the submemory banks, a data output main amplifier and a data input write amplifier are disposed in an area opposite to a row of the data terminal pads.

8. The semiconductor memory device according to claim 7, wherein each of the memory banks includes subarrays obtained by dividing a submemory bank into N/4 parts in a word line direction (N being a unit maximum number of bits) and into a plurality of parts in a bit line direction, and
for each subarray, a dynamic memory cell is disposed at an intersection of a sub word line and a bit line, sub word drivers are provided on both sides of the subarray in the word line direction, a sub word line of the subarray is selected by a main word line and a sub word line selection line, and sense amplifiers are provided on both sides of the subarray in the bit line direction.

9. The semiconductor memory device according to claim 8, wherein, over each subarray, write and read input and output lines are extended in the bit line direction and connected to a corresponding main amplifier and a corresponding write amplifier.

10. The semiconductor memory device according to claim 1,
wherein the data terminal pads are divided into a plurality of groups, each said group being associated with a respective group of submemory banks, and
said groups of submemory banks and their associated groups of data terminal pads are disposed in blocks which do not overlap each other on the semiconductor chip, including a block disposed to the first side of the peripheral circuit and a block disposed to the second side of the peripheral circuit.

11. The semiconductor memory device according to claim 10, further comprising a central portion which extends substantially across the semiconductor chip in a second direction, wherein said central portion is taken as a boundary, and in each of first and second semiconductor areas to opposite sides of said central area, a number of data terminal pads are arranged side by side in the second direction.

12. The semiconductor memory device according to claim 11, wherein, as for the data terminal pads, pads associated with a bus width of total N bits are divided in the second direction into pads associated with upper bits and pads associated with lower bits, and the pads associated with upper bits and the pads associated with lower bits are respectively distributed uniformly in the first direction.

13. The semiconductor memory device according to claim 12, further comprising pads associated with a bus width of upper N bits, wherein in the same way as the bus width of total N bits, the pads associated with a bus width of upper N bits are arranged so as to be divided in the second direction into pads associated with upper bits and pads associated with lower bits, and the pads associated with upper bits and the pads associated with lower bits are respectively distributed uniformly in the first direction.

14. The semiconductor memory device according to claim 11, wherein each of the memory banks is formed with dynamic memory cells, and the semiconductor chip is mounted on a package associated with a static RAM.

15. The semiconductor memory device according to claim 14, wherein submemory banks in the first semiconductor area include a submemory bank that has a data transmission route passing over other submemory banks and leading to a data terminal pad formed on the second semiconductor area.

16. The semiconductor memory device according to claim 15, wherein, in each of the submemory banks, a data output main amplifier and a data input write amplifier are disposed in an area opposite to a row of the data terminal pads.

17. The semiconductor memory device according to claim 16, wherein each of the memory banks includes subarrays obtained by dividing a submemory bank into N/4 parts in a word line direction (N being a unit maximum number of bits) and into a plurality of parts in a bit line direction, and for each subarray, a dynamic memory cell is disposed at an intersection of a sub word line and a bit line, sub word drivers are provided on both sides of the subarray in the word line direction, a sub word line of the subarray is selected by a main word line and a sub word line selection line, and sense amplifiers are provided on both sides of the subarray in the bit line direction.

18. The semiconductor memory device according to claim 17, wherein, over each subarray, write and read input and output lines are extended in the bit line direction and connected to a corresponding main amplifier and a corresponding write amplifier.

* * * * *